(12) United States Patent
Anderson (10) Patent No.: US 7,834,621 B2
(45) Date of Patent: Nov. 16, 2010

(54) ELECTROMAGNETIC TRACKING EMPLOYING SCALAR-MAGNETOMETER

(75) Inventor: Peter Traneus Anderson, Andover, MA (US)

(73) Assignee: General Electric Company, Schenectady, NY (US)

( * ) Notice: Subject to any disclaimer, the term of this patent is extended or adjusted under 35 U.S.C. 154(b) by 46 days.

(21) Appl. No.: 11/860,649

(22) Filed: Sep. 25, 2007

(65) Prior Publication Data

US 2009/0079426 A1     Mar. 26, 2009

(51) Int. Cl.
*G01V 3/00*      (2006.01)
(52) U.S. Cl. ....................... 324/300; 324/304
(58) Field of Classification Search ................ 324/301, 324/300, 304
See application file for complete search history.

(56) References Cited

U.S. PATENT DOCUMENTS

| | | | |
|---|---|---|---|
| 1,450,080 A | 3/1923 | Hazeltine | |
| 4,327,498 A * | 5/1982 | Setter et al. | 33/333 |
| 4,710,708 A | 12/1987 | Rorden | |
| 4,814,707 A * | 3/1989 | Marton | 324/304 |
| 4,849,692 A | 7/1989 | Blood | |
| 4,945,305 A | 7/1990 | Blood | |
| 5,425,382 A | 6/1995 | Golden | |
| 5,558,091 A | 9/1996 | Acker | |
| 5,592,939 A | 1/1997 | Martinelli | |
| 5,640,170 A | 6/1997 | Anderson | |
| 5,676,673 A | 10/1997 | Ferre | |
| 5,747,996 A * | 5/1998 | Fuchs | 324/207.17 |
| 5,782,765 A | 7/1998 | Jonkman | |
| 5,800,352 A | 9/1998 | Ferre | |
| 5,803,089 A | 9/1998 | Ferre | |
| 5,829,444 A | 11/1998 | Ferre | |
| 5,873,822 A | 2/1999 | Ferre | |
| 5,913,820 A | 6/1999 | Bladen | |
| 5,967,980 A | 10/1999 | Ferre | |
| 6,052,610 A * | 4/2000 | Koch | 600/424 |
| 6,073,043 A * | 6/2000 | Schneider | 600/424 |
| 6,129,668 A | 10/2000 | Haynor | |
| 6,172,499 B1 | 1/2001 | Ashe | |
| 6,175,756 B1 | 1/2001 | Ferre | |
| 6,201,387 B1 | 3/2001 | Govari | |
| 6,226,547 B1 | 5/2001 | Lockhart | |
| 6,246,231 B1 | 6/2001 | Ashe | |
| 6,269,324 B1 * | 7/2001 | Rakijas et al. | 702/190 |

(Continued)

FOREIGN PATENT DOCUMENTS

WO     WO 9736192     10/1997

OTHER PUBLICATIONS

U.S. Appl. No. 11/654,880, filed Jan. 18, 2007.

(Continued)

*Primary Examiner*—Louis M Arana
(74) *Attorney, Agent, or Firm*—Fletcher Yoder P.C.

(57) ABSTRACT

Provided is an electromagnetic tracking system, including at least one electromagnetic field receiver having at least one scalar-magnetometer, at least one electromagnetic field transmitter, and tracker electronics. Also provided is a method for electromagnetic tracking, including generating at least one magnetic field, sensing the at least one magnetic field with at least one scalar-magnetometer, and determining a relative position of the at least one scalar-magnetometer based on the sensed at least one magnetic field.

5 Claims, 6 Drawing Sheets

U.S. PATENT DOCUMENTS

| | | |
|---|---|---|
| 6,374,134 B1 | 4/2002 | Bladen |
| 6,424,853 B1 * | 7/2002 | Tsukada et al. ............ 600/409 |
| 6,445,943 B1 | 9/2002 | Ferre |
| 6,502,031 B2 | 12/2002 | Uehara |
| 6,539,327 B1 | 3/2003 | Dassot et al. |
| 6,701,179 B1 | 3/2004 | Martinelli |
| 6,774,624 B2 | 8/2004 | Anderson |
| 6,980,921 B2 | 12/2005 | Anderson |
| 7,015,859 B2 | 3/2006 | Anderson |
| 7,096,148 B2 | 8/2006 | Anderson |
| 7,158,754 B2 | 1/2007 | Anderson |
| 2005/0065433 A1 * | 3/2005 | Anderson ............... 600/424 |
| 2006/0058604 A1 | 3/2006 | Avinash |
| 2006/0106292 A1 | 5/2006 | Anderson |
| 2006/0247511 A1 | 11/2006 | Anderson |
| 2007/0080682 A1 * | 4/2007 | Govari et al. ............ 324/247 |

OTHER PUBLICATIONS

Takaaki Nara, et al.; "A Closed-Form Formula for Magnetic Dipole Localization by Measurement of Its Magnetic Field and Spatial Gradients"; Digital Object Identifier; 2006 IEEE; pp. 3291-3293.

* cited by examiner

ELECTROMAGNETIC TRACKING EMPLOYING SCALAR-MAGNETOMETER

BACKGROUND

This disclosure generally relates to tracking systems that employ magnetic fields to determine the position and orientation of an object, such as systems used for tracking instruments and devices during surgical interventions and other medical procedures. More particularly, this disclosure relates to a system and method that utilizes at least one scalar-magnetometer for tracking.

Tracking systems have been used in various industries and applications to provide positional information relating to various objects and devices. For example, electromagnetic tracking is useful in aviation applications, motion sensing applications, medical applications, and the like. In medical applications, tracking systems are employed to provide information to an operator (e.g., a clinician) that assist in locating a medical instrument or device that is not in the line of sight of the clinician (e.g., disposed internal to a patient). The information generally includes an image having a base image displayed on a monitor, and a visual indication of the instrument's position. For instance, the image may include a visualization of the patient's anatomy with an overlay (e.g., icon) that represents the location of the instrument relative to the patient. Typically, the displayed image is continuously updated to reflect the current position of the device. The base image of the patient's anatomy may be generated prior to, or during the medical procedure. For example, any suitable medical imaging technique, such as X-ray, computed tomography (CT), magnetic resonance imaging (MRI), positron emission tomography (PET), and ultrasound, may be utilized to generate the base image. Accordingly, the combination of the base image and the representation of the tracked instrument provide positioning information that enables a medical practitioner to manipulate the instrument to a desired location and to associate gathered information to a precise location.

To track a device, tracking systems utilize a variety of methods, including magnetic field generation and detection. In a system utilizing magnetic field generation and detection, at least one magnetic field is provided from a magnetic field source (e.g., transmitter), and the magnetic field is sensed by one or more sensors (e.g., receivers). In some systems, the transmitter includes a permanent magnetic, an electromagnet, or a combination thereof. Further, the receiver generally includes a sensing device, such as a coil of conductive material that is responsive to a magnetic field. For example, when a receiver is exposed to a magnetic field, a current and voltage indicative of the strength of the magnetic field is driven across the coil. Thus, based on the sensed current and voltage, processing can determine the position of the transmitter and receiver relative to one another. For example, processing may enable a determination of the magnetic fields between each of the transmitters and the receivers, and may employ the ratios of the magnetic fields to resolve the positions of the transmitter and the receiver relative to one another.

Further, the tracking system may employ multiple transmitters and/or receivers that enable processing to precisely resolve position and orientation of the transmitters and receivers (e.g., the X, Y and Z coordinates, as well as the roll, pitch and yaw angles). In other words, multiple magnetic fields and receivers enable tracking to resolve several degrees of freedom. For example, the transmitter may be employed to provide multiple magnetic fields, and/or the system may include multiple receivers. Accordingly, the plurality measurements sensed between the transmitters and receivers can be employed to triangulate the position and/or the orientation of the transmitters and the receivers relative to one another.

Several factors may contribute to the accuracy of tracking applications. For example, field distorters (e.g., conductive objects) may induce eddy currents that distort the magnetic field and, thus reduce the overall accuracy of the tracking systems. One solution to this concern includes lowering the operating frequency (e.g., the frequency of the generated magnetic field) to reduce the effects of eddy currents. For example, the magnetic field frequency may be reduced from 14 kilohertz (kHz) to 14 hertz (Hz) to reduce the effects of field distorters. However, the sensitivity of a receiver coil is approximately proportional to the sensed frequency and the accuracy of the system may be reduced when the system operates at lower frequencies.

Accordingly, there is a desire to provide a tracking system wherein the receivers have increased sensitivities at lower frequencies.

BRIEF DESCRIPTION

In accordance with an aspect, provided is an electromagnetic tracking system, including at least one electromagnetic field receiver having at least one scalar-magnetometer, at least one electromagnetic field transmitter, and tracker electronics.

In accordance with another aspect, provided is a method for electromagnetic tracking, including generating at least one magnetic field, sensing the at least one magnetic field with at least one scalar-magnetometer, and determining the relative position of the at least one scalar-magnetometer based on the sensed at least one magnetic field.

In accordance with yet another aspect, provided is an electromagnetic tracking receiver, including a scalar-magnetometer and at least one electromagnetic coil disposed proximate the scalar magnetometer, and having an orientation wherein driving a current across the coil is configured to change the direction of the static field sensed by the scalar-magnetometer.

In accordance with another aspect, provided is a method for electromagnetic tracking, including driving a plurality of coils disposed about a scalar-magnetometer to change the direction of a static field sensed by the scalar-magnetometer, sensing magnetic fields via the scalar-magnetometer, and determining a position of the scalar-magnetometer based on the sensed magnetic field.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
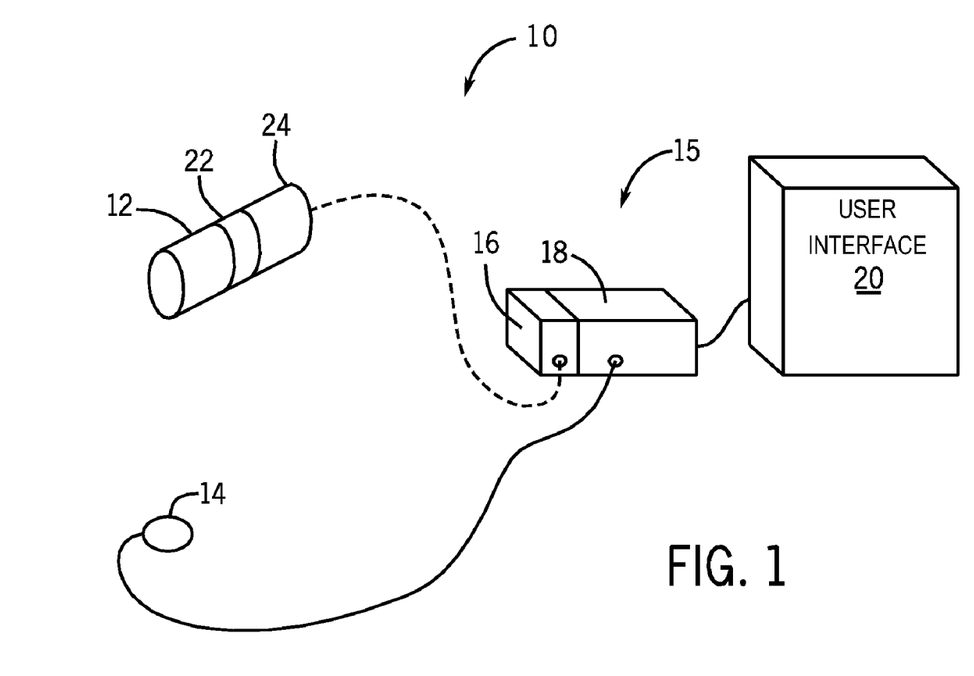
FIG. 1 illustrates an exemplary tracking system implementing certain aspects of the present technique.

FIG. 1 illustrates a tracking system 10 in accordance with an embodiment of the present technique. The tracking system 10 includes at least one transmitter 12, at least one receiver 14, tracker electronics 15, a drive unit 16, a processor 18, a user interface 20, a current source 22, and an instrument 24.

The transmitter 12 includes a magnetic field source that can be employed to generate a magnetic field. For instance, the at least one transmitter 12 may include an electromagnet that generates the desired magnetic field (e.g., radio frequency (RF) magnetic field). The magnetic field may be of sufficient magnitude to be sensed by a complementary device, such as the at least one receiver 14. In one embodiment, the at least one transmitter 12 includes a single dipole coil. For example, the at least one transmitter 12 may include a single dipole coil that is about 8 mm long and about 1.7 mm in diameter, with 7700 turns of American Wire Gauge (AWG) wire formed around a ferromagnetic core that is about 8 mm long and about 0.5 mm in diameter. When a current is provided across the single dipole coil, a single magnetic field is generated with a magnitude moment vector generally normal to the coil (e.g., along its axis) and having a frequency that is approximately the same as the frequency of the current driving the coil. For example, the at least one transmitter 12 in an electromagnetic tracking system is generally supplied with a sine wave current waveform having a frequency between about 8 kHz and about 40 kHz. Thus, the at least one transmitter 12 generates magnetic fields having frequencies between about 8 kHz and about 40 kHz. In a low frequency application, the at least one transmitter 12 may be supplied with frequencies between about 1 Hz to about 8 kHz.

Further, it may be desirable that the at least one transmitter 12 generates a plurality of magnetic fields. In one embodiment, the at least one transmitter 12 may include a plurality (e.g., more than one) of the coils. For example, the at least one transmitter 12 may be formed from three co-located orthogonal quasi-dipole coils (e.g., a coil-trio). When the coil-trio is energized, each coil generates a magnetic field. As a result, the coil-trio may be employed to generate three magnetic fields having magnitude vectors that are co-located and orthogonal to one another. Accordingly, in certain embodiments, the at least one transmitter 12 may include a single dipole coil, a plurality of dipole coils, a coil-trio, a plurality of coil-trios, and the like, or a combination thereof.

In certain embodiments, the at least one transmitter 12 includes a wireless configuration. In other words, the at least one transmitter 12 does not have a wired connection to various components of the tracking system 10 (e.g., the tracker electronics 15). In one embodiment, as discussed in further detail below, the at least one transmitter 12 may include an integral current source 20 (e.g., oscillator). Further, the system 10 may employ processing specifically suited for tracking the at least one transmitter 12 in a wireless configuration.

Further, in an embodiment of the tracking system 10 the at least one transmitter 12 includes a plurality of transmitters. For example, in the illustrated embodiment, the at least one transmitter 12 may include an array of transmitters and/or transmitter coils. In other embodiments, the at least one transmitter 12 may include a single transmitter and/or transmitter coil. The arrangement and placement of the at least one transmitter 12 may be varied to accommodate specific applications. For example, the at least one transmitter 12 may include a single transmitter or an array of transmitters arranged in a single plane.

Complementary to the at least one transmitter 12, the system 10 includes the at least one receiver 14. The at least one receiver 14 is configured to sense (e.g., receive) the magnetic field(s) generated by the at least one transmitter 12. For instance, when the at least one transmitter 12 is energized, the generated magnetic field may induce a response (e.g., a current and a voltage) into the at least one receiver 14. Generally, the response includes current induced across the at least one receiver 14 that is indicative of the magnetic field between the at least one transmitter 12 and the at least one receiver 14. As is discussed in further detail below with regard to processing, the magnetic field may be associated with the distance between the at least one transmitter 12 and the at least one receiver 14. Thus, the at least one receiver 14 may transmit a signal indicative of the magnetic field that can be processed to determine the magnetic field and the distance between the at least one transmitter 12 and at least one receiver 14.

In an embodiment in accordance with the present technique, the at least one receiver 14 includes a scalar-magnetometer. For example, the at least one receiver 14 may include an atomic-resonance magnetometer. The atomic-resonance magnetometer may include rubidium, potassium, cesium, or the like. Further in one embodiment, the at least one receiver 14 may include an Overhauser magnetometer. In yet another embodiment, the at least one receiver 14 may include a SERF (spin-exchange relation-free) magnetometer. As will be appreciated by those skilled in the art, each of the previously discussed scalar-magnetometers may provide high sensitivity. For example, an optically-pumped cesium vapor magnetometer is a highly sensitive (0.004 nT/√Hz) and accurate device. Overhauser magnetometers may achieve 0.01 nT/√Hz noise levels. Finally, SERF atomic magnetometers containing potassium vapor operate similarly to the cesium magnetometers described above yet can reach sensitivities lower than 1 fT/√Hz.

In another embodiment, the at least one receiver 14 may include a miniature atomic-resonance magnetometer. Miniature atomic-resonance magnetometers may include a form factor that is conducive to placement of the atomic-resonance magnetometers into medical devices. One embodiment may include coupling the at least one receiver 14 into the housing of a guidewire or a catheter, for instance.

Figure 2:
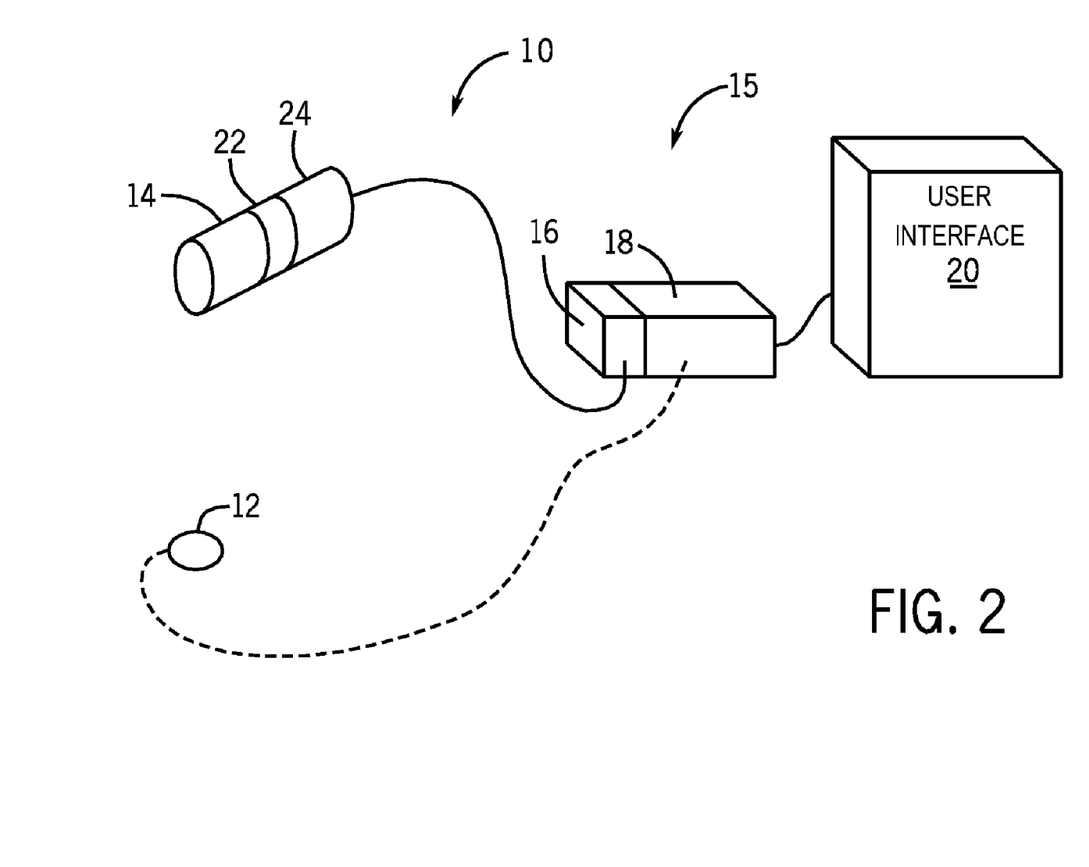
FIG. 2 illustrates an alternate embodiment of the exemplary tracking system implementing certain aspects of the present technique.

As will be appreciated, the magnetic field between the at least one transmitter 12 and the at least one receiver 14 can be measured regardless as to their mechanical relationship to one another. In other words, the positions of the at least one transmitter 12 and the at least one receiver 14 may be swapped (e.g., reversed). For example, as illustrated in FIG. 2, the at least one receiver 14 may be coupled to the instrument 24, and the at least one transmitter 12 may be located separate from the instrument 24. Accordingly, the magnetic field may be generated from the at least one transmitter 12 separate from the instrument 24, and received by the at least one receiver 14 proximate to the instrument 24 (e.g., a guidewire or catheter).

Referring again to FIG. 1, the system 10 further includes tracker electronics 15 including a drive unit 16, the processor 18, and the user interface 20. In accordance with certain implementations of the present technique, the drive unit 16 may be configured to provide a drive current (via a cable) to the at least one transmitter 12. The drive current may include a periodic waveform with a given frequency (e.g., a sine wave), for instance. In turn, the current across a coil of the at least one transmitter 12 may generate a magnetic field at the same frequency as the drive current. For example, the at least one transmitter 12 of the tracking system 10 may be supplied with sinewave current waveforms having frequencies between about 8 kHz and about 40 kHz and, thus, generate magnetic fields having frequencies between about 8 kHz and about 40 kHz. Further, in the illustrated embodiment the drive unit 16 is integral to the processor 18; however, in other embodiments, the drive unit 16 may include a unit that is separate from the processor 18. For example, the drive unit 16 may include the current source 22, such as a battery and/or an oscillator, which is integral to the instrument 24 and/or the at least one transmitter 12.

The tracker electronics 15 also include the processor 18. The processor 18 may include, for example, a digital signal processor, a CPU, or the like. In the illustrated embodiment, signals indicative of the magnetic fields sensed by the at least one receiver 14 are output to the processor 18 via a cable. Accordingly, the processor 18 may track the orientation and position of the at least one transmitter 12 based on the signals transmitted from the at least one receiver 14. For example, the at least one receiver 14 may produce output signals that are indicative of the magnetic field between the at least one transmitter 12 and the at least one receiver 14, and the processor 18 may process the magnetic field measurements to triangulate the position of the at least one transmitter 12 and the at least one receiver 14. When the magnetic fields each include different frequencies, processing may selectively filter each magnetic field out of the signal. For example, when driving the at least one transmitter 12 having a single dipole coil, a single drive current of a given frequency may be sufficient to identify the magnetic field. This is true because only a single transmitting coil is generating a magnetic field. However, when the at least one transmitter 12 (e.g., a coil-trio) is generating multiple magnetic fields, the at least one receiver 14 may sense the multiple magnetic fields simultaneously. As a result, a single combined signal from the at least one receiver 14 may be transmitted to the processor 18. To enable subsequent processing to identify each of the magnetic fields contained the combined signal the frequency of each of the generated magnetic fields may be varied. Due to the variations in frequency, processing can isolate the signals between each respective at least one transmitter 12 and each of the at least one receiver 14. Thereby, the system may determine the relative position and/or orientation of the at least one transmitter 12 and the at least one receiver 14.

In an embodiment having a wired configuration, the at least one transmitter 12 may be electrically coupled to the processor 18 and the at least one receiver 14. Accordingly, in a wired configuration, the measured phases of the waveforms driving each coil of the at least one transmitter 12 may be known. For example, the source of the drive current waveforms (e.g., the drive unit 16) may be embedded in the processor 18. The processor 18 may "know" the phases of the currents driving the at least one transmitter 12 and can parse out each signal indicative of the given phases and frequencies from the combined signal transmitted by the at least one receiver 14. With each of the phases identified and associated with each coil of the at least one transmitter 12, the processor 18 may implement any suitable algorithms to establish the position and/or orientation of the at least one transmitter 12 relative to the at least one receiver 14. However, in an embodiment including a wireless configuration, the at least one transmitter 12 may not have "known" phases of the current waveforms. For example, the wireless at least one transmitter 12 may be driven by the current source 22, such as an oscillator, coupled to the at least one transmitter 12. In one configuration, the current source 22 may generate each of the current waveforms independent from the processor 18 (i.e., the processor 18 does not have feedback or control relating to the phase of the two currents). For example, the at least one transmitter 12 may include a standalone device having a current source 22 that is generating magnetic fields independent of the processor 18. Thus, the processor 18 may incorporate additional considerations in processing to resolve the position and orientation of the at least one transmitter 12 (e.g., identify the phases of the current waveforms generated across at least one coil of the at least one transmitter 12).

Methods and techniques for processing the sensed signals to determine the relative position and orientation of the at least one transmitter 12 and the at least on receiver 14 may be found in U.S. Pat. No. 7,158,754, entitled "Electromagnetic Tracking System and Method Using a Single-Coil Transmitter," issued Jan. 2, 2007 and filed on Jan. 6, 2005, with inventor Peter Anderson, which is herein incorporated by reference.

The tracker electronics 15 also include a user interface 20. For example, the system 10 may include a monitor to display the determined position and orientation of a tracked object. As will be appreciated, the user interface 20 may include additional devices to facilitate the exchange of data between the tracking system 10 and the user. For example, the user interface 20 may include a keyboard, mouse, printers or other peripherals. While the processor 18 and the user interface 20 may be separate devices, in certain embodiments, the processor 18 and the user interface 20 may be provided as a single unit.

Further, in the illustrated tracking system 10, the at least one transmitter 12 is coupled to the instrument 24. Accordingly, the tracking system 10 may be employed to track the position of the instrument 24 relative to the at least one receiver 14 and the at least one transmitter 12. The instrument 24 may include a catheter, a drill, a guide wire, an endoscope, a laparoscope, a biopsy needle, an ablation device or other similar devices.

As discussed previously, an embodiment of the at least one receiver 14 may include a scalar-magnetometer. However, scalar-magnetometers intrinsically measure the magnitude of the magnetic field, but not the direction of the magnetic field. In other words, scalar-magnetometers measure the total strength of the magnetic field to which they are subjected, but do not necessarily provide an indication of the direction of the magnetic field. In operation, scalar-magnetometers are immersed in the earth's magnetic field and, thus, are sensitive to the magnitude of the vector sum of the earth's field and any additional magnetic fields (e.g., the magnetic field generated by the at least one transmitter 12). The earth's magnetic field may be much larger than the magnetic field generated by the at least one transmitter 12 and only the component of the at least one transmitter's field parallel to the earth's magnetic field contributes to the overall magnitude of the magnetic field. The at least one receiver 14 having a single scalar-magnetometer will respond the same as a receiver having a single coil, except the sensed orientation of the at least one receiver 14 is determined by the direction of the earth's magnetic field rather than the mechanical orientation of the at least one receiver 14. Accordingly, at least one receiver 14 having the single scalar-magnetometer can be employed to track the position, but not the orientation of the at least one receiver 14. To account for the scalar characteristics, the tracking system 10 may employ various arrangements of the at least one transmitter 12 and the at least one receivers 14 employing a scalar-magnetometer.

In a first embodiment, the at least one receiver 14 may include a single scalar-magnetometer and the at least one transmitter 12 may include one or more transmitters. Accordingly, the at least one receiver 14 may sense each of the magnetic fields generated by each of the at least one transmitters 12. As will be appreciated, processing may determine the position of the at least one receiver 14 by comparing the ratios of the sensed magnetic fields to triangulate the relative positions of the at least one transmitter 12 and the at least one receiver 14, as discussed previously. However, due to the inability of the scalar-magnetometer to indicate the direction of the magnitude vector, the orientation of the at least one receiver 14 may not be determined.

Figure 3:
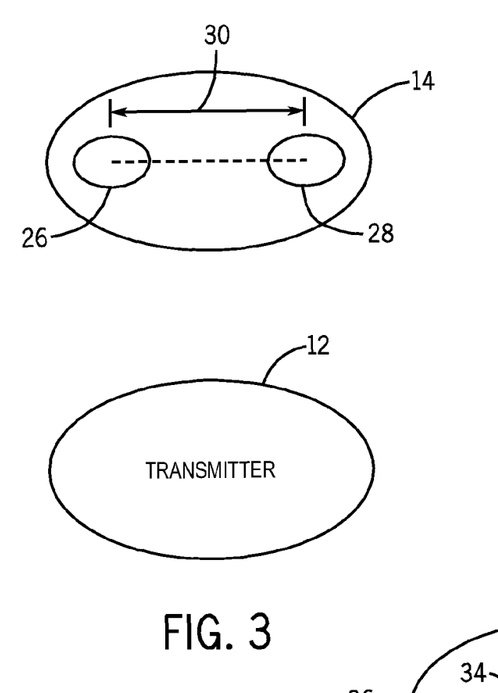
FIG. 3 illustrates an embodiment of at least one receiver and at least one transmitter in accordance with certain aspects of the present technique.

In one embodiment, the at least one receiver 14 may include more than one scalar-magnetometer. For example, FIG. 3 illustrates an embodiment of the at least one receiver 14 including two scalar-magnetometers. The at least one receiver 14 includes a first scalar-magnetometer 26 and a second scalar-magnetometer 28. The scalar-magnetometers 26 and 28 are spaced a given distance 30 from one another. As will be appreciated, processing may determine the position of each of the scalar-magnetometers 26 and 28 by comparing the ratios of the sensed magnetic fields, as discussed previously. Accordingly, in an embodiment where the scalar-magnetometers are fixed relative to one another, processing may also resolve the azimuth, the elevation and the position of the at least one receiver 14, but not the roll. Thus, in an embodiment including the at least one receiver 14 having two scalar-magnetometers fixed relative to the instrument 24, the tracking system 10 may track the position, azimuth, and elevation of the instrument 24.

Figure 4:
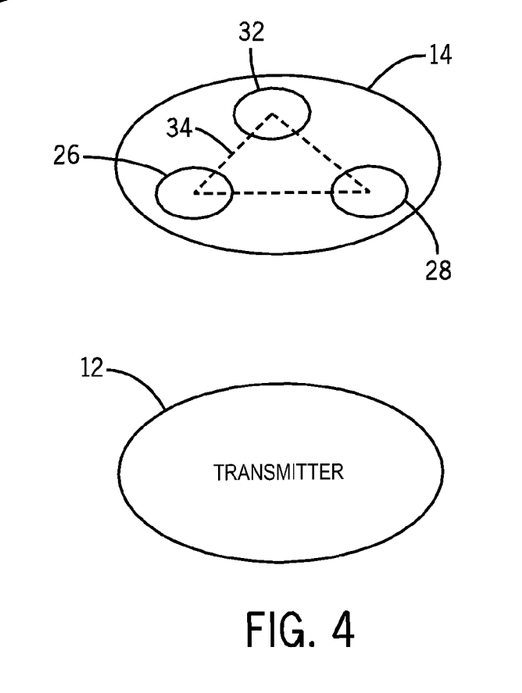
FIG. 4 illustrates another embodiment of at least one receiver and at least one transmitter in accordance with certain aspects of the present technique.

Another embodiment of the at least one receiver 14 may include more than two scalar-magnetometers. For example, FIG. 4 illustrates an embodiment of the at least one receiver 14 including three scalar-magnetometers. The at least one receiver 14 includes the first scalar-magnetometer 26, the second scalar-magnetometer 28, and a third scalar magnetometer 32. The scalar magnetometers 26, 28, and 32 are spaced apart from one another in a plane 34. As will be appreciated, processing may determine the position of each of the scalar-magnetometers 26, 28, and 32 by comparing the ratios of the sensed magnetic fields, as discussed previously. Accordingly, in an embodiment where the scalar-magnetometers are fixed relative to one another, processing may resolve the position and the orientation (e.g., the azimuth, the elevation, the roll) of the at least one receiver 14. Thus, in an embodiment including the at least one receiver 14 having more than two scalar-magnetometers fixed relative to the instrument 24, the tracking system 10 may track the position, azimuth, and elevation of the instrument 24.

Further, embodiments of the at least one receiver 14 may include any number of scalar-magnetometers. For example, an embodiment may include four or more scalar-magnetometers. In one embodiment, each of the scalar-magnetometers may be co-planar. In another embodiment, the scalar-magnetometers may not be co-planar. As will be appreciated, increasing the number of scalar-magnetometers employed in the at least one receiver 14 may enable processing to more accurately determine the position and/or orientation of the at least one receiver 14, and any devices (e.g., the instrument 24) coupled thereto. Embodiments may also include a plurality of the at least one receivers 14 that are each formed from any number of scalar-magnetometers.

Figure 5:
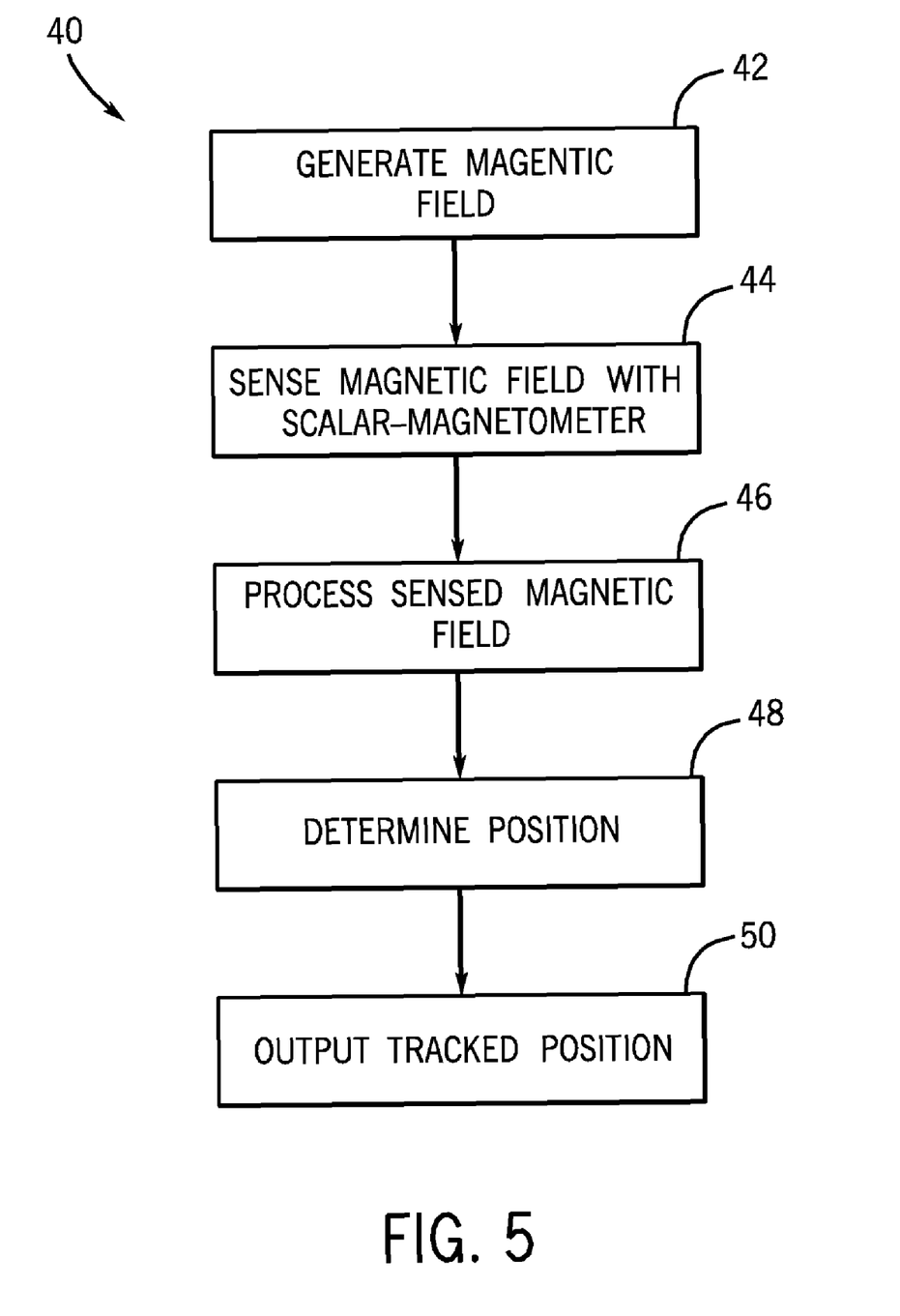
FIG. 5 is a flowchart of a method of electromagnetic tracking in accordance with certain aspects of the present technique.

FIG. 5 illustrates a method of tracking using scalar-magnetometers in accordance with an embodiment of the present technique. For example, the method 40 includes generating at least one magnetic field as illustrated at block 42. Generating at least one magnetic field, may include energizing the at least one transmitter 12, as discussed previously. For example the drive unit 16 and/or the current source 22 may drive a current across a single dipole coil, a plurality of dipole coils, a coil-trio, and/or a plurality of coil-trios, of the at least one transmitter 12. Further, the drive current and the generated at least one magnetic field may include differing frequencies, magnitudes and phases to accommodate the specific tracking application.

The method 40 also includes sensing the at least one magnetic field with a scalar-magnetometer, as illustrated at block 44. For example, the generated magnetic field (block 42) may be sensed by the at least one receiver 14 including the scalar-magnetometer. In one embodiment, the at least one receiver 14 may include one or more scalar-magnetometers 26, 28, and 32, as discussed previously. Further, sensing the at least one magnetic field (block 44) may include transmitting a signal indicative of the sensed magnetic field from the at least one receiver 14 to the processor 18.

The method 40 further includes processing the sensed magnetic field, as illustrated at block 46. In one embodiment, processing the sensed magnetic field (block 46) includes receiving a signal indicative of the sensed magnetic field (block 44). Processing may also include conditioning the signals and/or determining the magnetic field between the each of the at least one transmitters 12 and the at least one receivers 14.

The method 40 includes determining a position, as illustrated at block 48. For example, determining a position (block 48) may include determining the relative positions of the at least one transmitter 12, and the at least one receivers 14 based on the signals sensed by the at least one receiver 14 including scalar-magnetometers. For example, determining the magnetic fields may enable the system to compare the ratios of the magnetic fields to triangulate the position of the at least one transmitter 12 and the at least one receiver 14 relative to one another. Further, determining a position may also include determining the position of the instrument 24. For example, where the at least one transmitter 12 or the at least one receiver 14 is coupled to the instrument 24, the determined position of the at least one transmitter 12 and the at least one receiver 14 may be translated to provide a relative position of the instrument 24. Further, determining the position may also include determining the orientation of the at least one transmitter 12 and the at least one receiver 14 relative to one another. For example, where the system includes a plurality of scalar-magnetometers 26, 28, and 32, processing may be capable of resolving the relative positions and/or orientations of the at least one transmitter 12 and the at least one receiver 14.

Finally, the method 40 also includes outputting a tracked position, as illustrated at block 50. In one embodiment, outputting a tracked position (block 50) includes providing the position and/or the orientation of the at least one transmitter 12, the at least one receiver 14, and/or the instrument 24 to the user interface 20. For example, the user interface 20 may output a value, an image with an overlay, or other indication of position and/or orientation. Further, an embodiment may include transmitting the position and orientation data to a file, a data base, subsequent processing, or the like. As will be appreciated, tracking may include repetitions of the above discussed method 40 to enable the system 10 to continually determine the positions and/or orientation of the at least one receiver 14, the at least one transmitter 12, and/or the instrument 24. Accordingly, each of the steps of the method 40 may be accomplished in varying orders, or even simultaneously.

In another embodiment, the tracking system 10 may employ a configuration of the at least one receiver 14 that enables changing the direction of the sensitivity of the scalar-magnetometer. For example, in one embodiment, magnetic field sources (e.g., coils) may be employed around the scalar-magnetometer and energized to change the direction of the static field (e.g., the magnetic field of the environment, including the earth's magnetic field) applied to the scalar-magnetometer. In other words, coils surrounding the scalar-magnetometer can be energized to generate magnetic fields that offset the earth's magnetic field or other surrounding magnetic fields. By offsetting the earth's magnetic field, the direction of the scalar magnetometer's sensitivity can be controlled. For example, offsetting the earth's magnetic field may enable the scalar-magnetometer to be sensitive to a component of a magnetic field magnitude vector that would otherwise be insignificant when compared to the earth's magnetic field in another direction.

Figure 6:
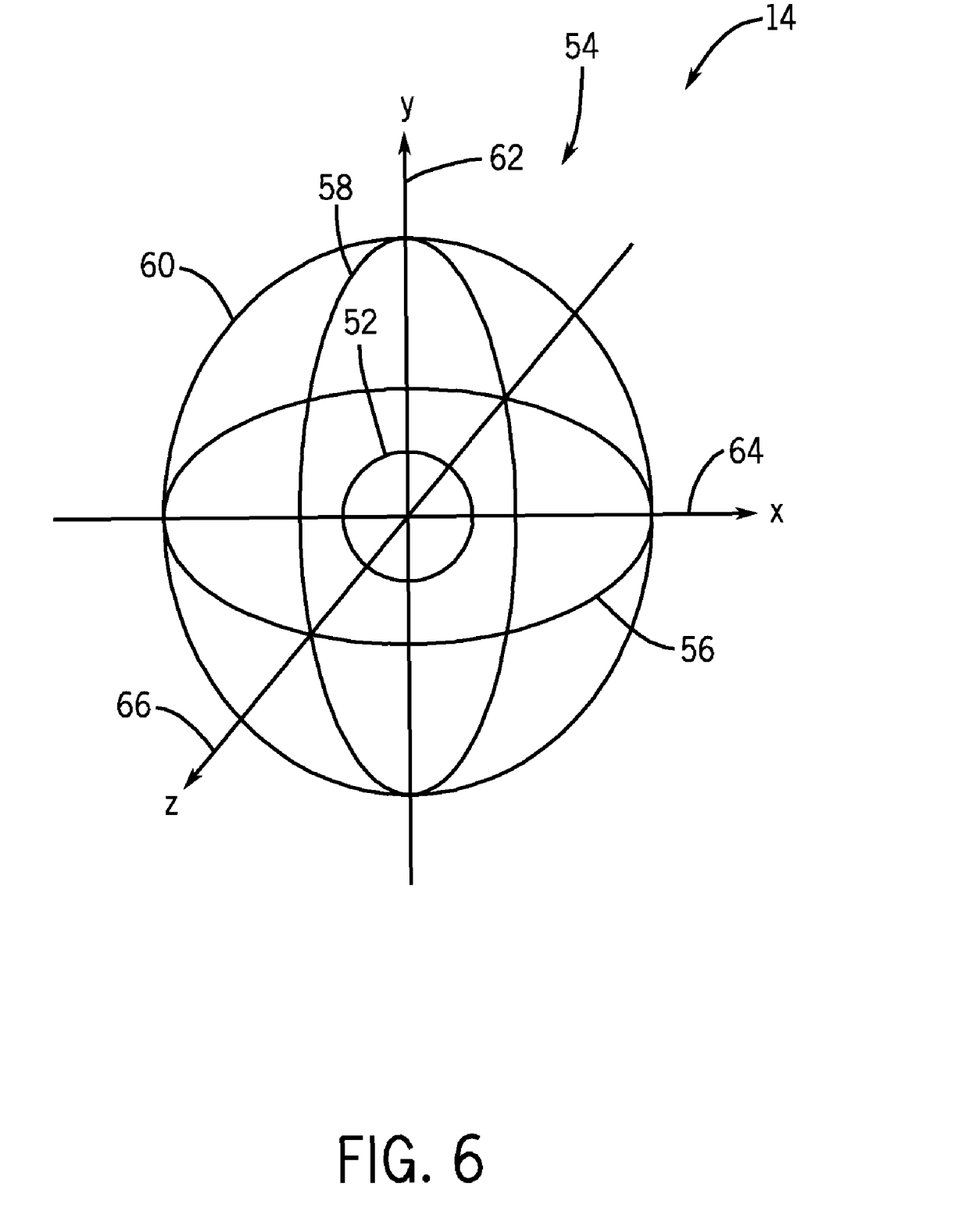
FIG. 6 illustrates an embodiment of the at least one receiver including a scalar-magnetometer in accordance with certain aspects of the present technique.

FIG. 6 illustrates an embodiment of the at least one receiver 14 having coils that generate at least one additional magnetic field to vary the sensitivity of a scalar-magnetometer. For example, the at least one receiver 14 includes a scalar-magnetometer 52 surrounded by a coil-trio 54 including three co-located orthogonal quasi-dipole coils. For example, the coil-trio 54 includes a first coil 56, a second coil 58 and a third coil 60 having axes that are generally orthogonal to one another. The scalar-magnetometer 52 is disposed in the center of the coil-trio 54.

Driving a current across the first coil 56, the second coil 58 and the third coil 60 generates magnetic fields having a first magnitude vector 62, a second magnitude vector 64, and a third magnitude vector 66, respectively. Accordingly, the magnitude vectors 62, 64, and 66 of the magnetic fields generated by each of the first, second and third coils 56, 58, and 60 can be varied to offset the earth's magnetic field and surrounding magnetic fields (e.g., electronics) and provide sensitivity of the scalar-magnetometer 52 in a desired direction. For example, the three coils 56, 58, and 60 may be driven with a current to offset the effects of the earth's magnetic field to increase the sensitivity of the scalar magnetometer in another direction.

In one embodiment, the three coils 56, 58, and 60 may be driven at three different time intervals with pulsed direct current (DC) fields to give approximately orthogonal sensitivities at the different time intervals. Thus, the system 10 can measure the magnetic fields sensed by the scalar-magnetometer 52 of the at least one receiver 14 during the first time interval, the second time interval, and the third time interval. In an embodiment including three coils 56, 58, and 60 surrounding the scalar-magnetometer, the system 10 may have at least three field measurements from the at least one receiver 14. In an ISCA arrangement wherein the at least one transmitter 12 includes a coil-trio, the system may take nine field measurements (e.g., three measurements during each of the three time intervals).

Figure 7:
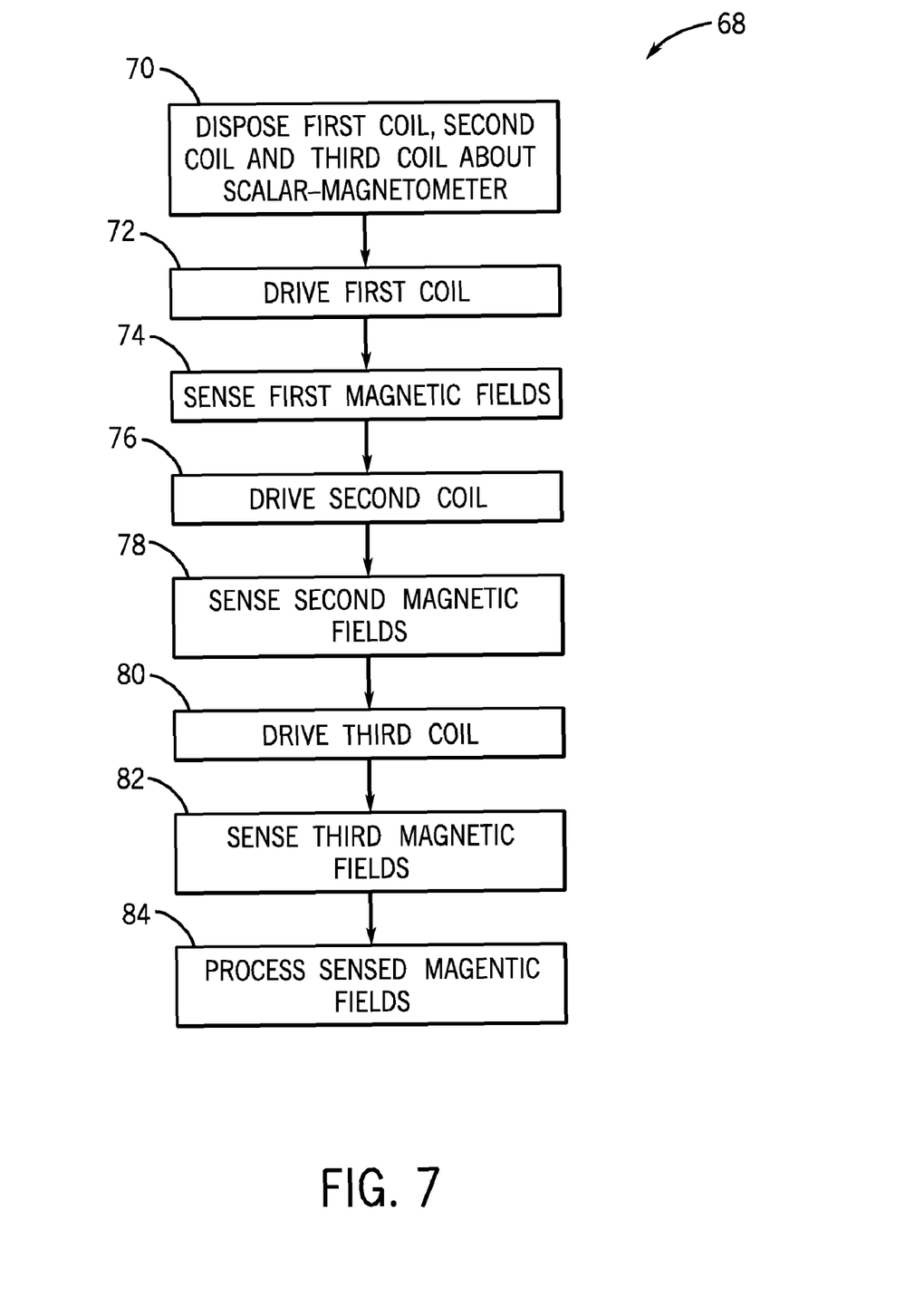
FIG. 7 is a flowchart of a method of electromagnetic tracking with the at least one receiver including a scalar-magnetometer in accordance with certain aspects of the present technique.

FIG. 7 is a flowchart illustrating a method 68 of tracking using a scalar-magnetometer surrounded by coils that are configured to manipulate the sensitivity of a scalar-magnetometer. The method 68 includes disposing a first, second, and third coil about the scalar-magnetometer, as illustrated at block 70. In one embodiment, disposing a first, second, and third coil about the scalar-magnetometer (block 70) may include disposing the coil-trio 54 about the scalar-magnetometer 52 as discussed with regard to FIG. 6. For instance, the first coil 56, the second coil 58, and the third coil 60 may be co-located orthogonal quasi-dipole coils. In another embodiment, any number of coils may be disposed about various locations surrounding the scalar-magnetometer 52. Another embodiment may include, a single coil or any number of coils disposed proximate to the scalar-magnetometer 52 that are configured to generate a magnetic field that can be sensed by the scalar-magnetometer 52 and may offset at least a portion of the static magnetic field.

The method 68 also includes driving the first coil, as illustrated at block 72. In one embodiment, driving the first coil (block 72) may include driving a current across the first coil 56 of the coil-trio 54 disposed about the scalar-magnetometer 52. In one embodiment, driving the current may cause the first coil 56 to generate a magnetic field that offsets at least a portion of the static magnetic field experienced by the scalar-magnetometer 52. Further, the current may be driven across the first coil (block 72) only during a first time interval. For example, the current may include a pulsed DC signal driven across the first coil 56 and configured to generate a generally constant magnitude magnetic field during the duration of the pulsed DC signal. In one embodiment, the constant magnitude magnetic field offsets at least a portion of the static magnetic field. For example, the magnitude of the magnetic field may be of sufficient magnitude to cancel out the component of the earth's DC magnetic field in the opposite direction of the first magnitude vector 62 that would otherwise be sensed by the scalar-magnetometer 52.

The method 68 also includes sensing the first magnetic fields, as illustrated at block 74. In one embodiment, the method 68 includes sensing the first magnetic fields (block 74) received by the scalar-magnetometer 52 during the period when the system 10 is driving the first coil (block 72). In other words, the system 10 may measure the magnetic fields at the scalar-magnetometer 52 during the first time interval. Accordingly, the measured magnetic field may include each of the magnetic fields generated from the at least one transmitter 12, and the first coil 56. In an embodiment wherein the at least one transmitter 12 generates a plurality of fields, the first magnetic fields may include each of the magnetic fields generated by the at least one transmitter 12. For example, where the at least one transmitter 12 includes a coil-trio generating three magnetic fields at three different frequencies, the first magnetic fields include each of the three fields generated by the at least one transmitter 12. In an embodiment wherein the at least one transmitter 12 includes a single dipole coil generating a single magnetic field, the first magnetic fields may include the single magnetic field. Thus, the at least one receiver 14 may transmit a signal that is indicative of the measured magnetic fields generated by the at least one transmitter 12 during the first time interval (e.g., when at least a portion of the static field has been offset and the scalar-magnetometer has increased sensitivity in a first direction).

The method 68 includes driving the second coil, as illustrated at block 76. In one embodiment, driving the second coil (block 76) may include driving a current across the second coil 58 of the coil-trio 54 disposed about the scalar-magnetometer 52. Further, the current may be driven across the second coil (block 76) during a second time interval. For example, similar to driving the first coil (block 72) the pulsed DC signal may be driven during the second time interval, such that the DC pulse provides a constant magnitude magnetic field during the second time period.

The method 68 also includes sensing the second magnetic fields, as illustrated at block 78. In one embodiment, the method 68 includes sensing the second magnetic fields (block 76) received by the scalar-magnetometer 52 during the period when the system 10 is driving the second coil (block 76). Thus, the at least one receiver 14 may transmit a signal that is indicative of the measured magnetic fields during the second time interval (e.g., when at least a portion of the static field has been offset and the scalar-magnetometer has increased sensitivity in a second direction).

The method 68 includes driving the third coil, as illustrated at block 80. In one embodiment, driving the second coil (block 80) may include driving a current across the third coil 58 of the coil-trio 54 disposed about the scalar-magnetometer 52. Further, the current may be driven across the third coil (block 80) during a third time interval. For example, similar to driving the first and second coil (blocks 72 and 76) the pulsed DC signal may be driven during the second time interval, such that the DC pulse provides a constant magnitude magnetic field during the third time period.

The method 68 also includes sensing the third magnetic field, as illustrated at block 82. In one embodiment, the method 68 includes sensing the third magnetic fields (block 82) received by the scalar-magnetometer 52 during the period when the system 10 is driving the third coil (block 80). Thus, the at least one receiver 14 may transmit a signal that is indicative of the measured magnetic fields during the third time interval (e.g., when at least a portion of the static field has been offset and the scalar-magnetometer has increased sensitivity in a third direction).

The method 68 includes processing the sensed magnetic fields, as illustrated at block 84. In one embodiment, the sensed magnetic fields may include the first, second and third sensed magnetic fields (blocks 74, 78 and 82). Each of the magnetic fields sensed may be processed to account for the magnetic field in a plurality of directions. For example, driving the first coil (block 72) may generate a magnetic field having the first magnitude vector 62 that offsets the earth's magnetic field in the opposite direction of the first magnitude vector 62. Thus, during the first time interval the scalar-magnetometer 52 may have increased sensitivity in the direction of the magnitude vector 62. Similarly, while the second coil is driven (block 76) the scalar-magnetometer 52 may have increased sensitivity in the direction of the second magnitude vector 64, and while the third coil is driven (block 80) the scalar-magnetometer 52 may have increased sensitivity in the direction of the third magnitude vector 66. Accordingly, processing may use each of the measurements taken during the first, second, and third time intervals to obtain a measurement of the sensed magnetic fields with sensitivity in the plurality of directions, as opposed to a single magnetic field measurement of magnitude. In other words, the plurality of coils may be employed to offset the earth's magnetic field such that the scalar-magnetometer 54 may have sensitivity in at least one direction based on the magnetic fields generated by the coils. In an embodiment that includes the coil-trio 54, processing may determine orientation of the at least one receiver 14 relative to the at least one transmitter 12. Further, in an embodiment that includes an arrangement wherein the at least one transmitter 12 includes a coil-trio (ISCA), processing may consider nine field measurements (e.g., three measurements during each of the three time intervals) in the determination of relative positions and orientations of the at least one transmitter 12, and the at least one receiver 14.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for electromagnetic tracking, comprising:
generating at least one magnetic field, wherein generating the at least one magnetic field includes sequentially generating at least three different magnetic fields;
sensing the at least one magnetic field with at least one scalar-magnetometer, wherein sensing the at least one magnetic field includes:
generating a first biasing magnetic field via a first coil disposed proximate the at least one scalar-magnetometer;
sensing the at least three magnetic fields in sequence during the generation of the first biasing magnetic field;
generating a second biasing magnetic field via a second coil disposed proximate the at least one scalar-magnetometer;
sensing the at least three magnetic fields in sequence during the generation of the second biasing magnetic field;
generating a third biasing magnetic field via a third coil disposed proximate the at least one scalar-magnetometer; and
sensing the at least three magnetic fields in sequence during the generation of the third biasing magnetic field; and
determining a relative position of the at least one scalar-magnetometer based on the sensed at least one magnetic field.

2. The method of claim 1, wherein the three different magnetic fields have three respective frequencies different from one another.

3. The method of claim 1, wherein sensing the at least one magnetic field with the at least one scalar-magnetometer comprises measuring the magnitude of the at least one magnetic field.

4. The method of claim 1, wherein sensing the at least one magnetic field with the at least one scalar-magnetometer comprises sensing the at least one magnetic field with more than one scalar-magnetometer.

5. The method of claim 1, wherein determining the relative position of the at least one scalar-magnetometer based on the sensed at least one magnetic field comprises calculating a distance based on a vector sum of earth's magnetic field and the at least one magnetic field.

* * * * *